(12) United States Patent
Kitamura et al.

(10) Patent No.: US 8,183,313 B2
(45) Date of Patent: May 22, 2012

(54) LIGHT GUIDE INCLUDING SURFACE-TREATED RESIN

(75) Inventors: Kyoji Kitamura, Kyoto (JP); Seiji Nakajima, Kyoto (JP); Masaki Nakamura, Kyoto (JP)

(73) Assignee: OMRON Corporation, Kyoto (JP)

( * ) Notice: Subject to any disclaimer, the term of this patent is extended or adjusted under 35 U.S.C. 154(b) by 508 days.

(21) Appl. No.: 12/439,689

(22) PCT Filed: Oct. 12, 2007

(86) PCT No.: PCT/JP2007/069932
§ 371 (c)(1),
(2), (4) Date: Mar. 3, 2009

(87) PCT Pub. No.: WO2008/059682
PCT Pub. Date: May 22, 2008

(65) Prior Publication Data
US 2010/0304153 A1    Dec. 2, 2010

(30) Foreign Application Priority Data
Nov. 16, 2006  (JP) .................................. 2006-310643

(51) Int. Cl.
*C08K 5/24* (2006.01)
*B32B 13/04* (2006.01)
(52) U.S. Cl. ........................................ 524/261; 428/446
(58) Field of Classification Search ............ 524/261
See application file for complete search history.

(56) References Cited

U.S. PATENT DOCUMENTS

| | | | |
|---|---|---|---|
| 7,501,289 B2 * | 3/2009 | Kubo et al. .................. | 436/518 |
| 2003/0116273 A1 | 6/2003 | Nakamura et al. | |
| 2004/0265602 A1 | 12/2004 | Kobayashi et al. | |

FOREIGN PATENT DOCUMENTS

| | | |
|---|---|---|
| DE | 1 521 249 A1 | 7/1969 |
| EP | 1 630 180 A1 | 3/2006 |
| JP | 50-75265 A | 6/1975 |
| JP | 62-250037 A | 10/1987 |
| JP | 2-279736 A | 11/1990 |
| JP | 2-279737 A | 11/1990 |
| JP | 02279737 A * | 11/1990 |
| JP | 2005-17431 A | 1/2005 |
| JP | 2006-23661 A | 1/2006 |

OTHER PUBLICATIONS

Communication pursuant to Article 94(3) EPC issued in European Application No. 07829668.8-1217 dated Sep. 23, 2010, 3 pages.
Extended European Search Report issued in European Application No. 07829668.8-1217 dated Dec. 17, 2009, 10 pages.
International Search Report w/translation from PCT/JP2007/069932 dated Jan. 8, 2008 (6 pages).
Written Opinion from PCT/JP2007/069932 dated Jan. 8, 2008 (5 pages).
Patent Abstract of Japan; Publication No. 02-279737 dated Nov. 15, 1990; Neos Co., Ltd (1 page).
Patent Abstracts of Japan; Publication No. 02-279736 dated Nov. 15, 1990; Neos Co., Ltd. (1 page).
Patent Abstracts of Japan; Publication No. 62-250037 dated Oct. 30, 1987; Toray Industries, Inc. (1 page).

* cited by examiner

*Primary Examiner* — Ling Choi
*Assistant Examiner* — Hui Chin
(74) *Attorney, Agent, or Firm* — Osha • Liang LLP

(57) ABSTRACT

A resin according to the present invention includes an ester bond as an essential component and comprises an amine thin membrane on a surface of the resin. This makes it possible to provide (i) a resin having an amine membrane on its surface, (ii) a production method thereof, and (iii) use thereof.

3 Claims, 1 Drawing Sheet

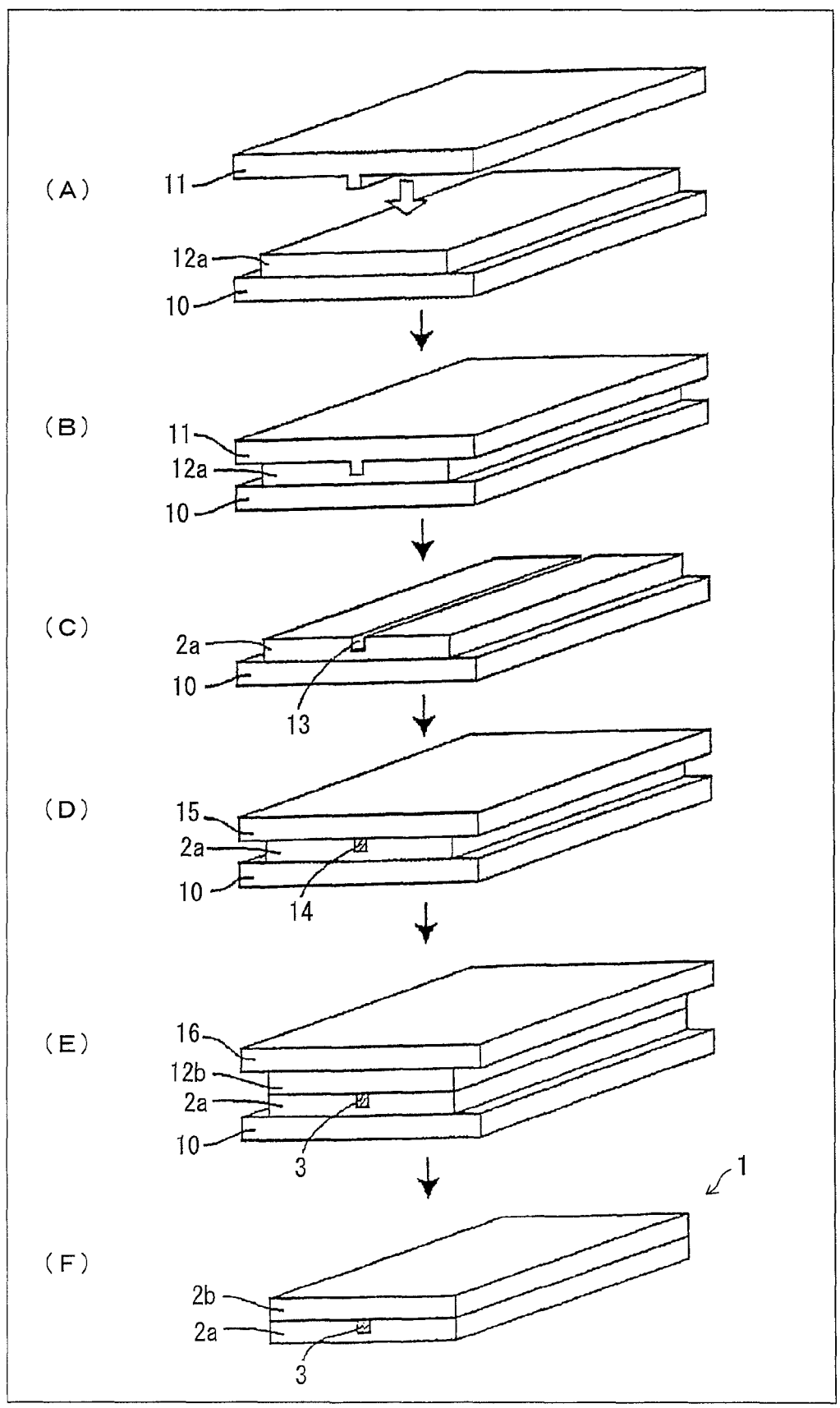

LIGHT GUIDE INCLUDING SURFACE-TREATED RESIN

TECHNICAL FIELD

The present invention relates to a surface-treated resin, a production method thereof, and use thereof. Particularly, the present invention relates to (i) a resin obtained by forming an amine thin membrane on a surface of a resin having an ester bond, (ii) a production method thereof, and (iii) use thereof.

BACKGROUND ART

With recent development of information society, high-speed and large-capacity data communications have been required. As a technique for meeting this requirement, an optical communication method is most expected as the effective technique. Also an optical communication network keeps on spreading.

The optical communication is categorized into: a long-distance communication which allows a city to be connected to other city; a middle-distance communication which allows a point to be connected to other point in a single area; and a short-distance communication which allows a device to be connected to other device or allows a section to be connected to other section in a single device.

An example of the short-distance communication is a communication based on a small device such as a mobile phone or the like. A wiring of a current mobile phone is mainly an electric wiring, and a flexible substrate made of polyimide is mainly used therein. Higher-traffic communication will increase in the future, so that higher-speed and larger-capacity transfer of optical signals will be required. Accordingly, a communication method using a film-type light guide will be mainly adopted.

The light guide is an optical component including: a core portion; and a clad portion which covers the core portion and which is adjusted so as to have a lower refraction factor than that of the core portion. Light is kept inside the core portion so as to be guided to a predetermined position.

In a small device such as a mobile phone or the like, various components are disposed with high density, so that it is often that a light guide has to be wired on surfaces of various components to save the space therein. Thus, the film-type light guide is required to be bendable with a small curvature radius.

As the film-type light guide which is bendable with a small curvature radius, for example, there is disclosed a film-type light guide arranged so that a concave is formed on a surface of a clad layer so as to extend in a direction orthogonal to a longer-side direction of a core portion (Patent Literature 1). Such a film-type light guide is produced as follows. On a sacrifice layer formed on a substrate by a stamper, a core portion resin or a clad portion resin is formed, and the resin is cured by irradiation of an ultraviolet ray, and then the sacrifice layer is dissolved.

CITATION LIST

Patent Literature 1
Japanese Patent Application Publication, Tokukai, No. 2006-23661 A (Publication Date: Jan. 26, 2006)

SUMMARY OF INVENTION

As to the film-type light guide disclosed in Patent Literature 1, an ultraviolet ray is irradiated to cure the resin in production processes, but the curing treatment performed only by the irradiation of ultraviolet ray fails to sufficiently cure the surface of the resin. This raises such a problem that tackiness (hereinafter, referred to as "tacking property") caused by the uncured resin remains.

If the surface of the resin is still tacky, the film adheres to a housing in being carried or in being incorporated into a circuit. This makes it difficult to handle the film. This results in poor efficiency in production.

Further, the failure of eliminating the tacking property on the surface means that the film is not sufficiently cured. Thus, abrasion resistance of the film is not sufficient. That is, if the film is repeatedly bended, the surface of the film is damaged, which results in such a problem that the film has some cracks or a such problem that a remaining indentation profile caused by being repeatedly bended deteriorates an optical property.

As a solution of the problems such as the tacking property and low abrasion resistance, a membrane may be formed on the surface of the resin. However, this solution is accompanied by such restriction that the membrane has to be thin because a thick membrane deteriorates the bendability.

A method for forming the thin membrane is roughly categorized into a physical technique and a chemical technique. Examples of the former technique include a thermal evaporation method, a sputtering method, an ion plating method, and the like. Each of these methods requires a large and complicate equipment. Thus, the productivity thereof is low.

On the other hand, examples of the latter technique include a vapor phase method, a liquid phase method, and the like. A typical example of the vapor phase method is a CVD (chemical vapor deposition) method. However, a calcination temperature is several hundreds or higher degree, so that it is difficult to form a membrane on an organic material by this technique. A typical example of the liquid phase method is Sol-Gel processing. An example of Sol-Gel processing is a method using a silane coupling agent. This is proposed by Japanese Patent Application Publication, Tokukai, No. 2005-17431 A and Japanese Patent Application Publication, Tokukai, No. 2003-176460 A.

However, in the method using the silane coupling agent, an adherend on which a thin membrane is to be formed is a base material having an OH bond, e.g., glass or the like. Thus, this method can not form a thin membrane on the surface of the resin. Further, this method is a liquid phase method, which raises such a problem that the membrane thickness becomes uneven as the volume decreases at the time of evaporation of a solvent component.

The present invention was made in view of the foregoing problems, and its object is to provide (i) a resin having an amine thin membrane on its surface, (ii) a production method thereof, and (iii) use thereof.

In view of the foregoing problems, the present inventors found the following fact. On a surface of a resin obtained by polymerizing a monomer having an ester bond, it is possible to so easily form an amine thin membrane under low temperature condition by bringing a vapor of an amine into contact with the resin, and the resin having the amine thin membrane on its surface has a small curvature radius, is free from any tacking property, and is excellent in abrasion resistance. In this manner, the resultant resin is extremely favorable as a material for an optical component such as a light guide and the like. With this finding, the present inventors completed the present invention.

That is, a resin according to the present invention includes an ester bond as an essential component, and comprises an amine thin membrane on a surface of the resin.

An amine reacts with the ester bond of the resin so as to form an amide bond, so that a thin membrane can be formed on the surface of the resin. Thus, the foregoing arrangement makes it possible to provide a resin which is free from any tacking property and is excellent in abrasion resistance and bendability. Therefore, the resin according to the present invention can be favorably used as a material for an optical component such as a light guide, a light diffusing plate, and the like for example.

Further, it is preferable to arrange the resin according to the present invention so as to be in a film shape. The resin in a film shape is required to have bendability as in a light guide used in a small device such as a mobile phone for example. Thus, it is necessary that the bendability is not lost also after formation of the membrane on the surface. The amine thin membrane formed on the surface of the resin according to the present invention is a thin membrane, so that the bendability of the film is not lost. Thus, the film-shaped resin according to the present invention can be favorably used as a material for an optical component required to be wired in a narrow space as in a light guide of a mobile phone or the like.

Further, it is preferable to arrange the resin according to the present invention so that the amine thin membrane is formed by bringing a vapor containing an amine into contact with the surface of the resin.

A method for easily forming a thin membrane on a surface of an organic material such as a resin has not been established. However, according to the foregoing arrangement, a gaseous amine reacts with the ester bond of the resin, so that the amine thin membrane is easily formed on the surface of the resin. This makes it possible to easily reduce the tacking property of the resin and enhance the abrasion resistance. Also the bendability of the resin can be kept.

Further, an amine can be evaporated at a relatively low temperature, so that the amine can be evaporated at a glass transition temperature of the resin or at a temperature lower than a heat distortion temperature. Thus, a base material having low heat resistance can be used, thereby enhancing usability of the base material.

Further, it is preferable to arrange the resin according to the present invention so that the amine is a primary amine. Among amines, the primary amine is particularly highly reactive, so that the primary amine is likely to react with the ester bond of the resin and is likely to form a thin membrane. Thus, according to the foregoing arrangement, it is possible to easily produce the resin which is free from any tacking property and is excellent in abrasion resistance and bendability. Further, the primary amine has two N—H bonds in each molecule, so that it is easy to produce a silane coupling agent.

Further, it is preferable to arrange the resin according to the present invention so that the amine is a silane coupling agent. According to the foregoing arrangement, the amine thin membrane has a silanol group, so that the resin according to the present invention can be made compatible with an inorganic material. This makes it possible to form a laminate membrane on the thus formed thin membrane. Thus, it is possible to easily produce a composite material containing the resin and the inorganic material.

Further, it is preferable to arrange the resin according to the present invention so that the resin is an acrylic resin.

The acrylic resin is widely used as a resin for an optical component such as a light guide or the like and has an ester bond. However, mere irradiation of an ultraviolet ray is highly likely to fail to cure the acrylic resin sufficiently. According to the foregoing arrangement, the amine thin membrane is formed on the surface of the acrylic resin, and it is possible to reduce the tacking property, enhance the abrasion resistance, and keep the bendability. This makes it possible to further enhance availability of the acrylic resin serving as an optical component resin.

Further, it is preferable to arrange the resin according to the present invention so that the acrylic resin is a cross-linking acrylic resin. According to the foregoing arrangement, cross-linking of the acrylic resin results in formation of a mesh-like polymer. Thus, it is possible to further enhance the abrasion resistance, the shock resistance, the heat resistance, the solvent-proof property, the oil resistance, and the like. This makes it possible to further enhance the availability of the resin of the present invention.

Further, it is preferable to arrange the resin according to the present invention so that the resin is a thermoplastic resin. The thermoplastic resin gives such thermoplasticity that the resin can be formed by heat and can reversibly keep the plasticity, thereby making the resin excellent in formability.

A light guide according to the present invention comprises a resin according to the present invention. As described above, the resin according to the present invention is free from any tacking property and is excellent in the abrasion resistance and the bendability. Thus, the light guide is easy to handle, has high strength, and is excellent in the bendability. Therefore, the light guide is so excellent as a light guide which has to be wired in a narrow space and to be bendable in a hinge or the like of a mobile phone, PDA, a laptop PC, or the like for example.

A method according to the present invention for producing a surface-treated resin comprises: a step A in which an amine is evaporated so as to generate a vapor containing the amine; and a step B in which the vapor containing the amine is brought into contact with a resin including an ester bond as an essential component so as to form an amine thin membrane on a surface of the resin.

In case of forming a membrane on the surface of the resin by applying a liquid amine onto the resin for example, the membrane is thick, so that it is so difficult to form the thin membrane and a trouble such as removal of an extra membrane is required in keeping the bendability of the resin. In contrast, according to the foregoing arrangement, the amine comes into contact with the resin not as liquid but as a vapor, so that the amine can be fixed on the surface of the resin as the thin membrane. Further, the foregoing steps can be carried out with a simple equipment such as a thermostatic chamber or the like. This does not require any large and complicate equipment. Thus, it is possible to so easily form the thin membrane on the resin. This makes it possible to easily provide the resin which is free from any tacking property and is excellent in the abrasion resistance and the bendability.

For a fuller understanding of other objects, characteristics, and advantages of the invention, reference should be made to the ensuing detailed description taken in conjunction with the accompanying drawings.

BRIEF DESCRIPTION OF DRAWINGS

FIG. 1 is a diagram illustrating steps of producing a light guide in accordance with a stamper method.

REFERENCE SIGNS LIST

| 1 | Light guide |
|---|---|
| 2a | Lower clad portion |
| 2b | Upper clad portion |

| | -continued |
|---|---|
| 3 | Core portion |
| 10 | Substrate |
| 11 | Convex stamper |
| 12a | Lower clad portion resin |
| 12b | Upper clad portion curable-resin composition |
| 13 | Trench portion |
| 14 | Core portion resin |
| 15 | Flat plate |
| 16 | Substrate |

DESCRIPTION OF EMBODIMENTS

One embodiment of the present invention is described as follows, but the present invention is not limited to this.

(1. Resin)

A resin according to the present invention includes an ester bond as an essential component and has an amine thin membrane on its surface. The resin is obtained by polymerizing a monomer and has at least one ester bond in its molecule. The ester bond reacts with an amine so as to generate an amide bond with the amine. This forms an amine thin membrane.

The monomer having the ester bond is not particularly limited, but examples thereof include: (1) an alicyclic compound having two or more (meth)acryloyl groups; (2) an aliphatic compound having two or more (meth)acryloyl groups; (3) an aromatic compound having two or more (meth)acryloyl groups; (4) a heterocyclic compound having two or more (meth)acryloyl groups; (5) a compound having a (meth)acryloyl group; and the like. Note that, the "(meth)acryloyl group" is an acryloyl group or a methacryloyl group.

Examples of the alicyclic compound having two or more (meth)acryloyl groups include: cyclopentandi(meth)acrylate, cyclohexanedi(meth)acrylate, methylcyclohexanedi(meth)acrylate, ethylcyclohexanedi(meth)acrylate, 1,3,5-trimethylcyclohexanedi(meth)acrylate, dicyclohexyldi(meth)acrylate, dicyclohexylmethanedi(meth)acrylate, tricyclohexylmethanedi(meth)acrylate, cycloheptanedi(meth)acrylate, cyclooctanedi(meth)acrylate, bicyclo[2.1.1]hexanedi(meth)acrylate, bicyclo[4.1.0]heptanedi(meth)acrylate, bicyclo[2.2.1]heptane(norbornane)di(meth)acrylate, bicyclo[3.2.1]octane, bicyclo[4.2.0]octanedi(meth)acrylate, bicyclo[4.3.0]nonanedi(meth)acrylate, bicyclo[4.4.0]decane(decahydronaphthalene)di(meth)acrylate, bicyclo[4.2.2]decanedi(meth)acrylate, tricyclo[5.2.1.0$^{2,6}$]decanedi(meth)acrylate, tricyclo[3.3.1.1$^{3,7}$]decanedi(meth)acrylate, methyladamantane, tricyclo[6.2.1.0$^{2,7}$]undecanedi(meth)acrylate, tetracyclo[6.2.1.1$^{3,6}$.0$^{2,7}$]dodecanedi(meth)acrylate, and the like.

Further, examples of the aliphatic compound having two or more (meth)acryloyl groups includes: ethyleneglycoldi(meth)acrylate, 1,2- and 1,3-propyleneglycoldi(meth)acrylates, 1,4-butanedioldi(meth)acrylate, neopentylglycoldi(meth)acrylate, glycerinedi(meth)acrylate, trimethylolethane and propanetri(meth)acrylates, pentaerythritoltri(meth)acrylate, pentaerythritoltetra(meth)acrylate, ditrimethylolpropanetetra(meth)acrylate, dipentaerythritolhexa(meth)acrylate, tri(meth)acrylic acid adducts of trimethylolethane and trimethylolpropanetriglycidylethers, tri(meth)acrylic acid adduct of glycerinetriglycidylether, tetra(meth)acrylic acid adduct of pentaerythritoltetraglycidylether, tetra(meth)acrylic acid adduct of ditrimethylolpropanetetraglycidylether, hexa(meth)acrylic acid adduct of dipentaerythritolhexaglycidylether, and the like.

Further, examples of the aromatic compound having two or more (meth)acryloyl groups include: ethyleneoxide or propyleneoxide adducts of bisphenols A and F, di(meth)acrylate, biphenyl-4,4-di(meth)acrylate, phenyleneoxide-1,4-di(meth)acrylate, 9,9-bis[4-(meth)acryloyloxyphenyl]fluorene, 9,9-bis[4-(meth)acryloylethoxyphenyl]fluorene, di(meth)acrylic acid adducts of bisphenols A and F diglycidylether, di(meth)acrylic acid adducts of bisphenols A and F bis(glycidyloxiethylether and glycidylpropylether, di(meth)acrylic acid adduct of biphenyl and 3,5,3',5'-tetramethylbiphenyl-4,4'-diglycidylether, di(meth)acrylic acid adduct of naphthalene-1,6-diglycidylether, tri(meth)acrylic acid adduct of triphenylmethane-4,4',4''-triglycidylether, tetra(meth)acrylic acid adduct of 1,2-tetrakis(p-glycidylphenylether)ethane, di(meth)acrylic acid adduct of 9,9-bis(p-glycidylphenylether)fluorene, and the like.

Further, examples of the heterocyclic compound having two or more (meth)acryloyl groups include: N,N-di(meth)acryloylpiperazine, N,N-di(meth)acryloyl-1,1-dimethylhydantoin, 1,3,5-tri(meth)acryloylhexahydro-1,3,5-triazine, bis[2-(meth)acryloyloxiethyl]-(2-hydroxyethyl)isocyanurate, tris[2-(meth)acryloyloxiethyl]isocyanurate, di(meth)acrylic acid adduct of 3,5-diglycidyl-1,1-dimethylhydantoin, tri(meth)acrylic acid adduct of triglycidylisocyanurate, 2,4,6-tris(dihydroxymethylamino)-1,3,5-triazinehexa(meth)acrylate, and the like.

Further, examples of the compound having one (meth)acryloyl group include: n-, i- and t-butyl(meth)acrylate, 2-ethylhexyl(meth)acrylate, methoxyethyleneglycol(meth)acrylate, phenyl(meth)acrylate, phenoxyethyl(meth)acrylate, benzyl(meth)acrylate, biphenyl(meth)acrylate, o-, m- and p-phenyl(meth)acrylates, o-, m-, and p-phenylbenzyl(meth)acrylates, 1-naphthyl(meth)acrylate, tetrahydrofurfuryl(meth)acrylate, furfuryl(meth)acrylate, 2-hydroxyethyl(meth)acrylate, 2-hydroxypropyl(meth)acrylate, 2-hydroxy-3-phenoxypropyl(meth)acrylate, dimethyl and diethylaminoethyl(meth)acrylates, N-(meth)acryloylmorpholine, and the like.

The resin has to include at least one ester bond in its molecule. Further, the resin may be a thermoplastic resin (thermoplastic polymer) having an ester bond. Examples of the thermoplastic polymer include polyethyleneterephthalate, polybutyleneterephthalate, polymethylmethacrylate, polycarbonate, polyethylenenaphthalate, polybutylenenaphthalate, and the like.

A polymerization method is not particularly limited and may be a chain reaction or may be a consecutive reaction. If a radical reaction is adopted, a polymer can be efficiently generated in a chain reaction, so that a photo radical polymerization method and/or a thermal radical polymerization method is favorably adopted. Note that, as an anionic polymerization initiator, it is possible to use a nucleophilic reagent such as alkali metal, metal hydroxide, Grignard reagent, and the like. As a cationic polymerization initiator, it is possible to use an electrophilic reagent such as protonic acid, Lewis acid, halogenated metal, stable carbonium ion, and the like.

The photopolymerization initiator used in the photo radical polymerization method is not particularly limited. As the photopolymerization initiator, it is possible to use a general photopolymerization initiator. Examples thereof include: carbonyl compound photopolymerization initiators such as acetophenones, benzophenones, diacetyls, benzyls, benzoins, benzoinethers, benzylmethylketanols, benzoylbenzoates, hydroxyphenylketones, and aminophenylketones; organic sulfur compound photopolymerization initiators such as thiramsulfides, and thioxanthones; and organic phosphorus photopolymerization initiators such as acylphosphinic acid esters. These photopolymerization initiators may be solely used or may be a combination of two or more thereof may be used.

With respect to a total amount of a resin composition containing a monomer, a ratio of the photo polymerization initiators blended is 0.5 wt % or more and 10 wt % or less, preferably 1 wt % or more and 7 wt % or less. If the ratio is less than 0.5 wt %, a photo curing property is insufficient. If the ratio exceeds 10 wt %, the curing reaction drastically proceeds. This unfavorably influences the curing property. Thus, the ratio less than 0.5 wt % or exceeding 10 wt % is not preferable. Note that, the resin composition is a composition which contains the aforementioned monomer as an essential component and which can be subjected to radical polymerization. The phrase "contains the monomer as an essential component" means that the monomer is contained as a constitutional unit. Thus, the resin composition may contain oligomer or polymer obtained by polymerizing the monomer.

It is general that the photo radical polymerization is performed by irradiating an ultraviolet ray to the resin composition containing the monomer. Examples of a light source of the ultraviolet ray include a super high pressure mercury lamp, a high pressure mercury lamp, a low pressure mercury lamp, a metal halide lamp, a carbon arc lamp, and a xenon lamp. It is preferable to use the high pressure mercury lamp or the metal halide lamp. An intensity of the ultraviolet ray is not particularly limited, but it is preferable that the intensity is 1000 mJ/cm$^2$ or more and 5000 mJ/cm$^2$ or less.

In the thermal radical polymerization method, the thermal polymerization initiator is used. The thermal polymerization initiator is decomposed by heat and generates a radical. As such a thermal polymerization initiator, it is preferable to use a thermal polymerization initiator whose thermal decomposition temperature is around 30° C. or higher and it is more preferable to use a thermal polymerization initiator whose thermal decomposition temperature is around 60° C. or higher. The thermal polymerization initiator is not particularly limited, but it is particularly preferable to use an organic peroxide generating no by-product such as gas or water. It is not preferable to use a thermal polymerization initiator whose thermal decomposition temperature is less than around 30° C. since such a thermal polymerization initiator makes the resin unstable.

The organic peroxide is not particularly limited, and it is possible to use conventionally known organic peroxides such as alkyl or aryl hydro peroxides, dialkyl or diaryl peroxides, alkyl peroxide acid and esters thereof, diacyl peroxides, ketone peroxides, and the like. These thermal polymerization initiators may be used solely or a combination of plural kinds may be used.

With respect to a total amount of the resin composition containing the monomer, a ratio of the thermal polymerization initiator blended is 0.5 wt % or more and 5 wt % or less, preferably 1 wt % or more and 3 wt % or less. If the ratio is less than 0.5 wt %, a curing property is insufficient. If the ratio exceeds 5 wt %, the curing reaction drastically proceeds. This unfavorably influences the resin property. Thus, the ratio less than 0.5 wt % or exceeding 5 wt % is not preferable.

In case of using the organic peroxide as the thermal polymerization initiator at the time of the thermal radical polymerization, the organic peroxide is heated up to a temperature over the thermal decomposition temperature for cure. Thus, the heating temperature depends on a type of the organic peroxide blended, but the heating time is generally 10 minutes or longer and 60 minutes or shorter.

The photopolymerization initiator and the thermal polymerization initiator may be solely used or may be used in combination. In case where the combination thereof is used, the ratio thereof is as described above.

In case of blending the photopolymerization initiator and the organic peroxide so as to perform photo curing and thermal curing, it is general that an ultraviolet ray is first irradiated so as to perform photo curing and then the resultant is heated so as to perform heat curing. Compared with the heat curing, the photo curing gives excellent handling property and high curing speed, so that it is preferable to adopt the photo curing in the present invention.

Note that, the "resin composition containing the monomer" used in the polymerization reaction may contain not only the monomer and the polymerization initiator but also small amounts of additives such as a polymerization inhibitor, a polymerization promoter, a defoaming agent, a light stabilizer, a heat stabilizer, a leveling agent, a coupling agent, an antistatic agent, and the like.

The resin is preferably an acrylic resin, more preferably a cross-linking acrylic resin. In case of the cross-linking acrylic resin, two (meth)acryloyl groups used to cross-link two main chains of the polymer are required. Thus, out of the aforementioned compounds, it is necessary to contain at least one compound having two or more (meth)acryloyl groups.

An acrylic resin which is not cross-linked may be a polymer of a compound having a (meth)acryloyl group or may be a copolymer of two or more compounds each having a (meth)acryloyl group.

A (meth)acrylate group on the end of the acrylic resin increases the bendability of the resin, so that it is more preferable that a urethane(meth)acrylate group is contained. The diol constituting an urethane bond is not particularly limited and it is possible to use polyester diol, polyether diol, polycarbonate diol, and the like, for example. Further, diisocyanate constituting the urethane bond is not particularly limited, and it is possible to use aliphatic diisocyanate (hexamethylenediisocyanate and the like), alicyclic diisocyanate (cyclohexanedicyanate and the like), aromatic diisocyanate (toluenediisocyanate and the like).

Further, the resin according to the present invention may be thermoplastic or may be curable, but it is preferable to use the curable resin since the curable resin allows formability to be improved and is suitable for production of an optical component such as a light guide or the like.

A shape of the resin according to the present invention is not particularly limited and the resin may be in a pellet shape, a powdery shape, a film shape, a plate shape, or the like. The resin according to the present invention exhibits greater availability in case of the film shape since such a resin is free from any tacking property and is excellent in the abrasion resistance and bendability. Thus, the film shape is preferable.

The "film" means not only the film shape but also a sheet shape. The thickness of the film is not particularly limited.

The film may be stretched as a stretched film. A method for stretching the film is not particularly limited and it is possible to adopt conventionally known stretching methods, e.g., a vertical stretching method in which the film is stretched in a longer side direction by use of a peripheral speed difference between rolls, a horizontal stretching method in which the film is stretched in a width direction while holding both ends of the film with stenter clips, a successive biaxial stretching method which is mixture of the foregoing two methods. In this case, each of the vertical stretching method and the horizontal stretching method may be performed as a single step or may be performed as two or more stages. Further, it is possible to adopt a simultaneous biaxial stretching method in which the film is stretched both in vertical and horizontal directions simultaneously.

As described above, the resin according to the present invention is a resin which includes an ester bond as an essential component and comprises an amine thin membrane on a surface of the resin. That is, an amine is the essential component in the resin according to the present invention, and the amine reacts with the ester bond so as to generate an amide bond. As a result, an amine thin membrane is formed on the surface of the resin. This makes it possible to obtain a resin which is free from any tacking property and is excellent in abrasion resistance and bendability.

The amine has to react with the ester bond, so that it is necessary to have an N—H bond. Thus, the amine is a primary amine and/or a secondary amine. Above all, it is preferable to use the primary amine since the primary amine is more reactive than the secondary amine. Further, the amine allows for formation of a laminate membrane on the thin membrane. Thus, it is more preferable to use a silane coupling agent. Further, by using the silane coupling agent, it is possible to reduce odor unique to the amine. This makes it possible to easily obtain such effect that the resin according to the present invention can be more easily produced.

The primary amine is not particularly limited, and examples of the silane coupling agent include 3-aminopropyltrimethoxysilane, 3-aminopropyltriethoxysilane, N-2(aminoethyl)3-aminopropylmethyldimethoxysilane, N-2(aminoethyl)3-aminopropyltrimethoxysilane, N-2(aminoethyl)3-aminopropyltriethoxysilane, and the like.

Further, examples of the primary amine other than the silane coupling agent include methylamine, ethylamine, ethanolamine, ethylenediamine, meramine, allylamine, cyclopropylamine, 2-propynylamine, n-propylamine, isopropylamine, 2-methoxyethylamine, n-butylamine, s-butylamine, t-butylamine, isobutylamine, 3-methoxypropylamine, cyclopentylamine, tetrahydrofurfurylamine, 1,2-dimethylpropylamine, 1-ethylpropylamine, amylamine, t-amylamine, isoamylamine, 2-methylbutylamine, 3-(dimethylamino)propylamine, 2,2-dimethyl-1,3-propanediamine, N-propylethylenediamine, N-propylenediamine, N-(2-aminoethyl)-1,3-propanediamine, 4-fluoro-1,3-phenylenediamine, 5-methylfurfurylamine, cyclohexylamine, 2,2-dimethyl-1,3-dioxolane-4-methaneamine, 1,3-dimethylbutylamine, 3,3-dimethylbutylamine, N-butylethylenediamine, N,N-diethylethylenediamine, N-isopropyl-1,3-propanediamine, N-propyl-1,3-propanediamine, triethylenetetramine, n-hexylamine, 2,4-difluorobenzylamine, 2,5-difluorobenzylamine, 2,6-difluorobenzylamine, 3,4-difluorobenzylamine, 3,5-difluorobenzylamine, 2-fluorobenzylamine, 3-fluorobenzylamine, 4-fluorobenzylamine, N-methyl-1,2-phenylenediamine, 1,1-diethyl-2-propynylamine, cycloheptylamine, cyclohexanemethylamine, 2-methylcyclohexylamine, 4-methylcyclohexylamine, n-heptylamine, 2-methylbenzylamine, 3-methylbenzylamine, 4-methylbenzylamine, 3-butoxypropylamine, 3-(diethylamino)propylamine, 2-methoxybenzylamine, 3-methoxybenzylamine, 4-methoxybenzylamine, phenethylamine, 2-phenoxyethylamine, 1-ethynylcyclohexylamine, 1-cyclohexylethylamine, cyclooctylamine, 2,3-dimethylcyclohexylamine, 1,3-cyclohexanebis(methylamine), 1,5-dimethylhexylamine, 2-ethylhexylamine, 1-methylheptylamine, N-hexylenediamine, 3-(diethoxymethylsylyl)propylamine, N,N-diethyldiethylenetriamine, N,N-dimethyldipropylenetriamine, tetraethylenepentaamine, α-ethylbenzylamine, β-methylphenethylamine, 3-phenyl-1-propylamine, 4-methylphenethylamine, 2-ethoxybenzylamine, 2-methoxyphenethylamine, 3-methoxyphenethylamine, 4-methoxyphenethylamine, n-octylamine, t-octylamine, 2-ethylhexylamine, 1-methylheptylamine, 1,5-dimethylhexylamine, 3-isopropoxypropylamine, n-nonylamine, 4-ethylphenethylamine, 1-methyl-3-phenylpropylamine, 4-phenylbutylamine, 2,3-dimethoxyphenethylamine, 2,5-dimethoxyphenethylamine, 3,4-dimethoxyphenethylamine, 5-amino-1,3,3-trimethylcyclohexanemethylamine, decylamine, undecylamine, 2-butyl-2-ethyl-1,5-pentandiamine, 3-(dibutylamino)propylamine, cyclododecylamine, dodecylamine, 2-fluoro-5-methylaniline, 2-(trifluoromethyl)benzylamine, 3-(trifluoromethyl)benzylamine, 4-(trifluoromethyl)benzylamine, 2-fluorophenylethylamine, 3-fluorophenylethylamine, 4-fluorophenylethylamine, 2,2-diethoxyethylamine, 2,2-dimethoxyethylamine, 4,4-diethoxybutylamine, aniline, 2-ethylaniline, 3-ethylaniline, 4-ethylaniline, o-toluidine, m-toluidine, p-toluidine, 2,3-dimethylaniline, 2,4-dimethylaniline, 2,5-dimethylaniline, 2,6-dimethylaniline, o-anisidine, m-anisidine, o-phenetidine, m-phenetidine, p-phenetidine, 4-methoxy-2-methylaniline, 2,4,6-trimethylaniline, 2-isopropylaniline, 2-amino-1-butanol, 4-amino-1-butanol, aminodiphenylmethane, 2-(2-aminoethylamino)ethanol, 2-(2-aminoethyl)-1-methylpyrrolidine, 4-(2-aminoethyl)morpholine, 4-(1-aminoethyl)phenolpropoxylate, 1-(2-aminoethyl)piperazine, N-(2-aminoethyl)-1,3-propanediene, 2-(2-aminoethyl)pyridine, 1-(2-aminoethyl)pyrrolidine, 1-methylhexylamine, 2-aminoheptane, 1-aminohomopiperidine, 1-aminoindan, 3-aminoisoxazole, 2-methoxyisopropylamine, 5-amino-2-methoxypyridine, 4-(aminomethyl)piperidine, 2-amino-2-methyl-1-propanol, 2-(aminomethyl)pyridine, 3-(aminomethyl)pyridine, 4-(aminomethyl)pyridine, 4-aminomorpholine, N-(4-aminophenyl)piperidine, 2-amino-3-picoline, 1-aminopiperidine, 4-aminopiperidine, 1-amino-2-propanol, 3-amino-1-propanol, 4-(3-aminopropyl)morpholine, 1-(3-aminopropyl)-2-pipecoline, N-(3-aminopropyl)-1,3-propanediamine, 1-(3-aminopropyl)-2-pyrrolidinone, 3-aminopropyltriethoxysilane, 3-aminopropyltrimethoxysilane, 3-aminopyrrolidine, 4-amino-2,2,6,6-tetramethylpiperidine, 5-amino-1,3,3-trimethylcyclohexanemethylamine, and the like.

Further, the secondary amine is not particularly limited, and it is possible to use, for example, N-phenyl-3-aminopropyltrimethoxysilane as the silane coupling agent. Further, examples of the secondary amine other than the silane coupling agent include dimethylamine, N-ethylmethylamine, diethylamine, N-methylpropynylamine, diethylamine, N-methylisopropylamine, N-methylisopropylamine, N-ethylethylenediamine, N-methyl-1,3-propanediamine, N-ethylisopropylamine, N-methylbutylamine, N-methyl-t-butylamine, diallylamine, N-ethyl-2-methylallylamine, diisopropylamine, dipropylamine, N-ethylbutylamine, N-methylpentylamine, bis(2-methoxyethyl)amine, N-(trimethylsylyl) allylamine, N,N'-diethylenediamine, N,N-dimethyl-N'-ethylethylenediamine, N-methylcyclohexylamine, N-propylcyclopropanemethylamine, N-t-butylisopropylamine, N-methylhexylamine, N-propylbutylamine, N,N-diethyl-N'-methylethylenediamine, N,N'-diethyl-1,3-propanediamine, N-t-butyltrimethylsylylamine, N-benzylmethylamine, allylcyclohexylamine, N-ethylcyclohexylamine, dibutylamine, diisobutylamine, N,N'-diisopropylethylenediamine, N,N,N'-triethylethylenediamine, N-ethylbenzylamine, N-methylphenethylamine, allylcyclohexylamine, N-t-butyl-1,1-dimethylpropargylamine, N-t-butyl-1,1-dimethylallylamine, N-isopropylcyclohexylamine, t-amyl-t-butylamine, N,N'-diisopropyl-1,3-propanediamine, N-isopropylbenzylamine, N-t-amyl-1,1-dimethylallylamine, N-t-butylcyclohexylamine, di-t-amylamine, dipentylamine, N,N'-di-t-butylethylenediamine, N-allyl-α-methylbenzylamine, N-butylbenzylamine, N-t-butylbenzylamine, N-(trimethylsylylmethyl)benzylamine, dihexylamine, t-amyl-t-octylamine, N-methyldihexylamine, N-methyldodecylamine, dioctylamine, and the like.

Note that, the amines may be solely used or a combination of two or more kinds may be used.

In case of using the resin for purpose of use requiring the bendability as in the light guide, when the light guide and the amine thin membrane are thick, the bendability is lowered. Thus, in reducing the tacking property of the resin and enhancing the abrasion resistance by use of the amine thin membrane, it is necessary to achieve the bendability of the light guide as an essential condition.

In order to achieve the bendability of the light guide, it is preferable to set the total thickness of the light guide and the amine thin membrane to 800 μm or less. In case where the amine thin membrane is thick, it is necessary to suppress the thickness of the light guide.

In the light guide, a size of a core portion serving as a light path is determined depending on a size of a light projector or a light receiver. In order to minimize the light loss in the core portion, the thickness of the core portion has to be at least 30 μm, and the thickness of a clad portion covering the core portion accordingly has to be at least 50 μm.

Thus, the thickness of the light guide is preferably 50 μm or more and 800 μm or less, more preferably 80 μm or more and 300 μm or less. Further, the thickness of the amine thin membrane is preferably 0.01 μm or more and 5 μm or less, more preferably 0.05 μm or more and 2 μm or less.

The amine thin membrane may be formed in any manner as long as the amine thin membrane is formed on the surface of the resin. In view of reduction of the tacking property and enhancement of the abrasion resistance, it is preferable that the amine thin membrane is uniformly formed on the entire surface, but the surface does not have to be entirely covered by the amine thin membrane as long as it is possible to obtain effect such as the reduction of the tacking property and/or the enhancement of the abrasion resistance. Note that, the "surface" means an interface between the resin and air. In case where the resin is in a film shape for example, the resin has a front surface and a rear surface. The resin may be shaped in any manner as long as the thin membrane is formed on at least one surface, and it is more preferable that the thin membrane is formed on each of both the surfaces.

A method for forming the amine thin membrane on the surface of the resin is not particularly limited, but it is preferable to bring a vapor containing an amine into contact with the surface of the resin. The vapor containing an amine can be generated by heating and evaporating the exemplified amine for example. The exemplified amine can be evaporated at a temperature lower than a glass transition temperature of the resin or a heat distortion temperature of the resin, so that evaporation can be performed at a relatively low temperature. This makes it possible to form the thin membrane on the surface of the resin. That is, the resin according to the present invention can be produced at a low temperature, so that a base material whose heat resistance is low can be used. Thus, unlike the CVD method, this does not raise such a problem that a calcinations temperature is several hundreds degree and the method accordingly cannot be applied to an organic material. As a result, its versatility is high.

A method for bringing a vapor containing an amine into contact with the surface of the resin is not particularly limited, but it is possible to adopt: a method in which the resin and the amine are placed in a container which can be tightly closed and then the container is placed in a thermostatic chamber or the like and is heated so as to fill the container with a saturated vapor of the amine; a method in which a vapor containing the amine is sprayed onto the surface of the resin. When the vapor comes into contact with the surface of the resin, an amide bond can be formed between the amino group and the ester bond. As a result, the amine thin membrane can be formed on the surface of the resin.

The "vapor containing an amine" is preferably a vapor made of amine, but a vapor made of a substance other than the amine, e.g., a small amount of a moisture vapor or the like may be contained to such a degree that formation of the amine thin membrane is not hampered. Note that, in the present specification, the "vapor" denotes a gaseous substance in which small drops of a liquid float (Dictionary of Science And Chemistry, 4th Edition, page 603, published by Iwanami Shoten, Publishers).

An amount of the amine to be evaporated may be such that the thin membrane can be formed on the surface of the resin. For example, there is used an amine whose amount is equal to or larger than a volume calculated in accordance with an area size of the surface of the resin and the above-described favorable thickness of the amine thin membrane (e.g., 0.01 μm or more and 5 μm or less, or 0.05 μm or more and 2 μm or less). Note that, an upper limit of the amount of the amine to be evaporated is not particularly limited. In case of performing a reaction in the tightly closed container, the amount of the amine formed on the surface of the resin is determined depending on a saturated vapor pressure, and the reaction occurs only on the surface layer in theory. Thus, an excessive membrane is so unlikely to be formed.

Another method for forming the amine thin membrane on the surface of the resin is as follows. For example, the resin is immersed in a chamber containing an amine treatment solution, and the resin is picked up at 10 cm/min, and then the resin is immersed in a chamber containing isopropyl alcohol and is rinsed so as to remove an extra membrane, and then the resin is dried in a vapor atmosphere of isopropyl alcohol.

A strong chemical bond between the amine and the ester bond occurs only in the interface of the resin, and the thick membrane is positioned on a top of the thin membrane, so that the extra membrane can be removed through rinse.

In this manner, it is possible to form the amine thin membrane on the surface of the resin without evaporating the amine into a vapor. However, it is preferable to adopt the method using a vapor since the method does not require removal of the extra membrane, and can be carried out in a simple manner, and gives high efficiency.

Even if the thus surface-treated resin, i.e., the resin having the amine thin membrane on its surface contains an uncured resin therein, the surface of the resin is coated with the amine membrane, so that the resultant resin is free from any tacking property. Thus, the resin does not adhere to the housing at the time of production. Further, the resin is excellent in the abrasion resistance. Moreover, the amine is formed as the thin membrane, so that the bendability of the resin is not lost. The resin according to the present invention has such an extremely excellent characteristic and can be so easily produced at a low temperature as described above.

Whether the amine thin membrane is formed or not can be confirmed by adopting a technique for surface analysis, e.g., by performing analysis using FT-IR, a transmission type electron microscope, a scanning type electron microscope, an X ray micro analyzer, a scanning type probe microscope, X ray photoelectron spectroscopy, μ-X ray photoelectron spectroscopy, color laser microscope, and the like. Above all, FT-IR (ATR method) is preferable since its sensitivity at the time of detection is high. According to the FT-IR (ATR method), a difference between the resin according to the present invention and an untreated product in absorption spectrum is calculated, thereby confirming whether the amine thin membrane is formed or not.

Note that, the thickness of the amine thin membrane can be measured by the foregoing techniques, but an extra membrane is so unlikely to be formed on the surface of the resin according to the present invention in the foregoing manner. Thus, basically, it is less necessary to measure and manage the thickness of the membrane.

It is preferable that the resin according to the present invention is in a film shape as described above. In producing the film, it may be so arranged that the resin is formed into a film shape beforehand and then the amine thin membrane is formed. As the formation technique, it is possible to adopt a conventionally known formation technique. For example, it is possible to adopt injection formation, extrusion formation, blow formation, vacuum formation, compression formation, and a similar technique. Further, a film may be cut out from the resin on which the amine thin membrane has been formed.

A purpose of use of the resin according to the present invention is not particularly limited but can be used as a material for various optical components such as a light guide, a Fresnel's lens, a lenticular lens, a micro lens, a prism sheet, a light reflector, a light diffusing plate, a diffraction grating, and the like. Even if the resin according to the present invention is not in the film shape, the resin is useful since the resin can be a material for an optical component as in the case where a film is cut out from the plate-like resin for example.

(2. Light Guide)

A light guide according to the present invention comprises the resin according to the present invention. As described above, the light guide has such important characteristics that the light guide is bendable with a small curvature radius, is free from any tacking property, and has excellent handling property and abrasion resistance particularly in a small device such as a mobile phone. The resin according to the present invention has the amine thin membrane on its surface, so that the foregoing characteristics are achieved. Thus, the resin is greatly useful as a material for the light guide.

A method for producing the light guide including the resin according to the present invention is not particularly limited as long as the resin according to the present invention is used as a resin of the light guide, and a conventionally known method is applicable. For example, it is possible to adopt a selective polymerization method, a method obtained by combining photolithography and RIE method, a direct exposure method, a bleach method, a stamper method, and the like. Above all, it is particularly preferable to adopt the stamper method since this achieves high productivity and low cost.

FIG. 1 illustrates steps for forming the light guide in accordance with the stamper method. First, as illustrated by (A) of FIG. 1, a lower clad portion resin 12a is applied onto a substrate 10 in accordance with a conventionally known method such as a spin coating method or a doctor-blade method and then is pressed by a convex stamper 11.

Subsequently, with the pressure condition kept, photo curing and/or heat curing is performed, thereby forming a lower clad portion 2a having a trench portion 13 of the core portion ((B) of FIG. 1 and (C) of FIG. 1). After the convex stamper 11 is released, the trench portion 13 is filled with a core portion resin 14, and photo curing and/or heat curing is performed with a flat plate 15 pressed, thereby forming a core portion 3 ((D) of FIG. 1).

Lastly, an upper clad portion curable-resin composition 12b is applied, and photo curing and/or heat curing is performed with a substrate 16 pressed, thereby forming an upper clad portion 2b ((E) of FIG. 1). Then, the substrate is removed so as to complete formation of a light guide 1 ((F) of FIG. 1). Note that, in case of performing the photo curing, a transparent substrate such as a glass plate is used as each of the substrates 10 and 16.

The present invention is not limited to the description of the embodiments above, but may be altered by a skilled person within the scope of the claims. An embodiment based on a proper combination of technical means disclosed in different embodiments is encompassed in the technical scope of the present invention.

EXAMPLES

With reference to the following Examples, the present invention is further detailed as follows, but the present invention is not limited to this. One skilled in the art can alter, modify, and change the arrangement in many ways so as not to depart from the spirit and scope of the invention.

<Method for Evaluating Tacking Property>

The tacking property was evaluated in accordance with a quick stick method. This method was as follows.

Surfaces each having a tacking property were overlaid without any load. The one surface was placed lower and the other surface was held by a tensile tester. The other surface was pulled up at a speed of 30.5 cm/min with an angle of 90° with respect to the lower surface so as to measure a resistance thereof. When no resistance was measured, the surface was regarded as having no tacking property. When any resistance was measured, the surface was regarded as having a tacking property.

<Method for Evaluating Abrasion Resistance>

A sample was bended so that its radius was 2 mm, and then the bended sample was restored. Such a cycle was repeated 1000 times, and then damage of a surface of the sample was confirmed with eyes. The same test was performed with respect to both a front surface and a rear surface of the sample.

<Method for Evaluating Whether Thin Membrane is Formed or not>

A surface of the formed thin membrane was analyzed in accordance with FT-IR (ATR method), and a difference from an untreated product was calculated so as to determine whether there is any difference or not, thereby determining whether the thin membrane was formed or not.

Example 1

On a polyethyleneterephthalate (hereinafter, referred to as "PET") film, there was applied a resin composition (I) which had been prepared by stirring and blending 100 parts by weight of AH-600 (product of KYOEISYA CHEMICAL Co., LTD) serving as a cross-linking acrylic resin and 1 part by weight of photopolymerization initiator Lucirin TPO (product of BASF).

Next, an ultraviolet ray of 3,600 mJ/cm$^2$ was irradiated with the PET film pressed by a flat stamper so as to give a laminate layer film.

The film was cut into a sample of 5 mm×50 mm, and the cut sample and 1 g of γ-aminopropyltrimethoxysilane (KBM-903: product of Shin-Etsu Chemical Co., Ltd.) were placed in a container, and the container was placed in a chamber whose structure allowed itself to be tightly closed, and the chamber was left in a thermostatic chamber of 70° C. for 2 hours, thereby performing a surface treatment.

After the sample was retrieved, it was confirmed that the surface was free from any tacking property.

Further, as a result of evaluation of abrasion resistance of the sample, it was confirmed that the surface of AH-600 and the surface of the PET film were free from any damage.

Example 2

The same operation as in Example 1 was performed except that polymethylmethacrylate (hereinafter, referred to as "PMMA") was used instead of the PET film of Example 1, so as to give a laminate layer film, thereby performing a surface treatment.

After retrieving the sample, it was confirmed that the surface was free from any tacking property.

Further, as a result of evaluation of abrasion resistance of the sample, it was confirmed that the surface of AH-600 and the surface of the PMMA film were free from any damage.

Example 3

The same operation as in Example 1 was performed except that octylamine was used instead of γ-aminopropyltrimethoxysilane of Example 1 so as to give a laminate layer film, thereby performing a surface treatment.

After retrieving the sample, it was confirmed that the surface was free from any tacking property.

Further, as a result of evaluation of abrasion resistance of the sample, it was confirmed that the surface of AH-600 and the surface of the PET film were free from any damage.

Example 4

On a quartz glass, there was applied a resin composition (II) which had been prepared by stirring and blending 40 parts by weight of AH-600, 60 parts by weight of 041 MA (product of KYOEISYA CHEMICAL Co., LTD) both serving as cross-linking acrylic resins, and 1 part by weight of photopolymerization initiator Lucirin TPO (product of BASF).

Next, an ultraviolet ray of 3,600 mJ/cm$^2$ was irradiated with the resin composition (II) pressed by a convex stamper so as to give a lower clad layer. A concave portion serving as a core portion formed on the lower clad layer is filled with a resin composition (III) prepared by stirring and blending 50 parts by weight of AH-600, 50 parts by weight of 041 MA, and 1 part by weight of photopolymerization initiator Lucirin TPO. An ultraviolet ray of 3,600 mJ/cm$^2$ was irradiated so as to give a core layer.

Further, the resin composition (II) was applied thereon, and an ultraviolet ray of 3,600 mJ/cm$^2$ was irradiated so as to give an upper clad layer. These laminate membranes were peeled off from the quartz glass, thereby obtaining a laminate layer film serving as the light guide.

To the sample of 5 mm×50 mm obtained by cutting the film-type light guide, evaporated γ-aminopropyltrimethoxysilane was sprayed so as to perform a surface treatment.

After retrieving the sample, it was confirmed that the surface was free from any tacking property.

Further, as a result of evaluation of abrasion resistance of the sample, it was confirmed that both the surfaces of the film-type light guide were free from any damage.

Comparative Example 1

The same operation as in Example 1 was performed except that a quartz glass was used as an adherend instead of the AH-600 and the PET film so as to perform a surface treatment.

As a result, it was confirmed that no laminate membrane was formed on the surface.

Comparative Example 2

The same operation as in Example 1 was performed except that polyimide was used as an adherend instead of the AH-600 and the PET film so as to perform a surface treatment.

As a result, it was confirmed that no laminate membrane was formed on the surface.

Comparative Example 3

The same operation as in Example 1 was performed except that γ-acryloxypropyltrimethoxysilane (KBM-5130: product of Shin-Etsu Chemical Co., Ltd.) was used instead of γ-aminopropyltrimethoxysilane so as to give a laminate layer film, thereby performing a surface treatment.

As a result, after retrieving the sample, it was confirmed that a tacking property remained on the surface.

Further, as a result of evaluation of abrasion resistance of the sample, it was confirmed that the surface of the AH-600 and the surface of the PET film were damaged.

Comparative Example 4

The same operation as in Example 1 was performed except that γ-glycidoxypropyltrimethoxysilane (KBM-403: product of Shin-Etsu Chemical Co., Ltd.) instead of γ-aminopropyltrimethoxysilane so as to give a laminate layer film, thereby performing a surface treatment.

As a result, after retrieving the sample, it was confirmed that a tacking property remained on the surface.

Further, as a result of evaluation of abrasion resistance of the sample, it was confirmed that the surface of the AH-600 and the surface of the PET film were damaged.

Table 1 shows results of Examples 1 through 4 and Table 2 shows results of Comparative Examples 1 through 4.

TABLE 1

|  | Example 1 | Example 2 | Example 3 | Example 4 |
|---|---|---|---|---|
| Treatment solution | KBM-903 | KBM-903 | Octylamine | KBM-903 |
| Adherend (front) | AH-600 | AH-600 | AH-600 | AH-600:50/041MA:50 |
| Adherend (rear) | PET | PMMA | PET | AH-600:50/041MA:50 |
| Treatment condition | 70° C. × 2 h | 70° C. × 2 h | 70° C. × 2 h | Vapor spray |
| Tacking property | Not found | Not found | Not found | Not found |
| Abrasion resistance | Excellent | Excellent | Excellent | Excellent |

TABLE 2

|  | Comparative Example 1 | Comparative Example 2 | Comparative Example 3 | Comparative Example 4 |
|---|---|---|---|---|
| Treatment solution | KBM-903 | KBM-903 | KBM-5103 | KBM-403 |
| Adherend (front) | — | — | AH-600 | AH-600 |
| Adherend (rear) | Quartz glass | Polyimide | PET | PET |
| Treatment condition | 70° C. × 2 h | 70° C. × 2 h | 70° C. × 2 h | 70° C. × 2 h |

TABLE 2-continued

|  | Comparative Example 1 | Comparative Example 2 | Comparative Example 3 | Comparative Example 4 |
|---|---|---|---|---|
| Tacking property | — | — | Found | Found |
| Abrasion resistance | — | — | Poor | Poor |

The results of Examples 1 through 3 show that the resin in which an ester bond is included as an essential component and an amine thin membrane is formed by bringing a vapor of an amine into contact with the resin can be produced at a low temperature, and is free from any tacking property, and is excellent in abrasion resistance. Further, according to the method for evaluating abrasion resistance, the resultant resin can be bended with a small curvature radius such as 2 mm. This shows that the resin has excellent bendability.

Further, the result of Example 4 shows that also the light guide produced by using the resin according to the present invention is free from any tacking property and is excellent in abrasion resistance and bendability.

On the other hand, the results of Comparative Examples 1 and 2 show that: the amine thin membrane is not formed on the surface by using the quartz glass or polyimide having no ester bond as an adherend, so that it is naturally impossible to achieve the effect of the present invention. That is, in order to obtain the resin according to the present invention, it is essential that the adherend has the ester bond.

Further, the results of Comparative Examples 3 and 4 show that: the surface treatment using the adherend having the ester bond and using the silane coupling agent having no amino group does not allow for achievement of the effect of the present invention. That is, a silanol group does not contribute to formation of the thin membrane, so that it is necessary to treat the resin having the ester bond with an amine.

The present invention is not limited to the description of the embodiments above, but may be altered by a skilled person within the scope of the claims. An embodiment based on a proper combination of technical means disclosed in different embodiments is encompassed in the technical scope of the present invention.

As described above, a resin according to the present invention includes an ester bond as an essential component, and comprises an amine thin membrane on a surface of the resin.

This makes it possible to exhibit such effect that a resin which is free from any tacking property and is excellent in abrasion resistance and bendability can be provided.

Further, a method according to the present invention for producing a surface-treated resin comprises: a step A in which an amine is evaporated so as to generate a vapor containing the amine; and a step B in which the vapor containing the amine is brought into contact with a resin including an ester bond as an essential component so as to form an amine thin membrane on a surface of the resin.

This makes it possible to exhibit such effect that a thin membrane can be so easily formed on the surface of the resin and a resin which is free from any tacking property and is excellent in abrasion resistance and bendability can be provided.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

As described above, the resin according to the present invention includes an ester bond as an essential component and comprises an amine thin membrane on a surface of the resin. Therefore, the resin can be produced at a low temperature, and is free from any tacking property, and is excellent in abrasion resistance and bendability. Thus, the resin according to the present invention can be favorably used as a material for optical component of a light guide or the like. In this way, the resin is widely applicable to information and communication industries.

The invention claimed is:

1. A light guide, comprising a resin having an ester bond as an essential component, the resin including an amine thin membrane on a surface of the resin, the amine thin membrane having a thickness of 0.01 µM or more and 5 µM or less.

2. The light guide as set forth in claim 1,
wherein the resin forms a lower clad layer, a core layer, and an upper layer; and
wherein the upper clad layer is laminated on the lower clad layer and on the core layer.

3. The light guide as set forth in claim 2,
wherein the lower clad layer, the core layer, and the upper clad layer are each a product obtained by curing a cross-linking acrylic resin and the amine is a silane coupling agent.

* * * * *